United States Patent
Tan et al.

(10) Patent No.: US 8,030,967 B1
(45) Date of Patent: Oct. 4, 2011

(54) METHOD AND APPARATUS INVOLVING A RECEIVER WITH A SELECTABLE PERFORMANCE CHARACTERISTIC

(75) Inventors: Jian Tan, Fremont, CA (US); Matthew H. Klein, Redwood City, CA (US); Atul V. Ghia, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 170 days.

(21) Appl. No.: 12/363,653

(22) Filed: Jan. 30, 2009

(51) Int. Cl.
*H03K 19/094* (2006.01)
*H03K 3/00* (2006.01)
*H03B 1/00* (2006.01)

(52) U.S. Cl. .......................................... 326/83; 327/108
(58) Field of Classification Search .................. 326/68, 326/82, 86, 87
See application file for complete search history.

(56) References Cited

U.S. PATENT DOCUMENTS

| | | | | |
|---|---|---|---|---|
| 6,940,302 B1 * | 9/2005 | Shumarayev et al. | ........... | 326/26 |
| 6,956,442 B2 * | 10/2005 | Groen et al. | .................... | 331/57 |
| 7,038,519 B1 * | 5/2006 | Pang et al. | ................... | 327/278 |
| 7,145,359 B2 * | 12/2006 | Hein et al. | ........................ | 326/38 |
| 7,236,018 B1 * | 6/2007 | Wang et al. | .................... | 327/108 |
| 7,307,446 B1 * | 12/2007 | Shumarayev et al. | ........... | 326/26 |
| 7,528,635 B2 * | 5/2009 | Kwasniewski et al. | ........ | 327/108 |
| 7,626,422 B2 * | 12/2009 | Kim et al. | ........................ | 326/83 |
| 2006/0006901 A1 * | 1/2006 | Groen et al. | ..................... | 326/27 |
| 2007/0013411 A1 * | 1/2007 | Asaduzzaman et al. | ........ | 326/83 |
| 2007/0263749 A1 * | 11/2007 | Teng et al. | ..................... | 375/312 |

* cited by examiner

*Primary Examiner* — Shawki Ismail
*Assistant Examiner* — Dylan White
(74) *Attorney, Agent, or Firm* — David L. McCombs; John L. King

(57) ABSTRACT

A circuit has a programmable mode control section, and a receiver section with first and second input terminals and an output terminal. The method and apparatus involve setting the mode control section to one of first and second states in response to user input, and operating the receiver section in first and second operational mode when the mode control section respectively has the first and second states, wherein in the first operational mode the receiver section provides higher performance and consumes more power than in the second operational mode.

9 Claims, 7 Drawing Sheets

METHOD AND APPARATUS INVOLVING A RECEIVER WITH A SELECTABLE PERFORMANCE CHARACTERISTIC

FIELD OF THE INVENTION

The invention relates to integrated circuit devices (ICs). More particularly, the invention relates to receiver circuitry in an IC.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

In the case of an FPGA having a receiver circuit, some users will prefer that the circuit provide high performance without regard to power consumption, whereas other users will prefer that the circuit operate with low power consumption, even if there is a reduced level of performance. A pre-existing receiver circuit can be designed to provide high performance, but in that case the circuit does not optimally meet the needs of users who prefer low power consumption. Alternatively, a pre-existing receiver circuit can be designed to provide low power consumption. But in that case the circuit does not optimally meet the needs of users seeking high performance. Therefore, although pre-existing receiver circuits have been generally adequate for their intended purposes, they have not been entirely satisfactory in all respects.

SUMMARY

One of the broader forms of the invention involves circuitry that includes: a mode control section that is programmable to have one of first and second states, and a receiver section having first and second input terminals and an output terminal. The receiver section is responsive to the mode control section for operating in a first operational mode when the mode control section has the first state, and for operating in a second operational mode when the mode control section has the second state, wherein in the first operational mode the receiver section provides higher performance and consumes more power than in the second operational mode.

Another of the broader forms of the invention involves a method of operating circuitry having a programmable mode control section, and a receiver section with first and second input terminals and an output terminal. The method includes: setting the mode control section to one of first and second states in response to user input, and operating the receiver section in a first operational mode when the mode control section has the first state and in a second operational mode when the mode control section has the second state, wherein in the first operational mode the receiver section provides higher performance and consumes more power than in the second operational mode.

DETAILED DESCRIPTION

Figure 1:
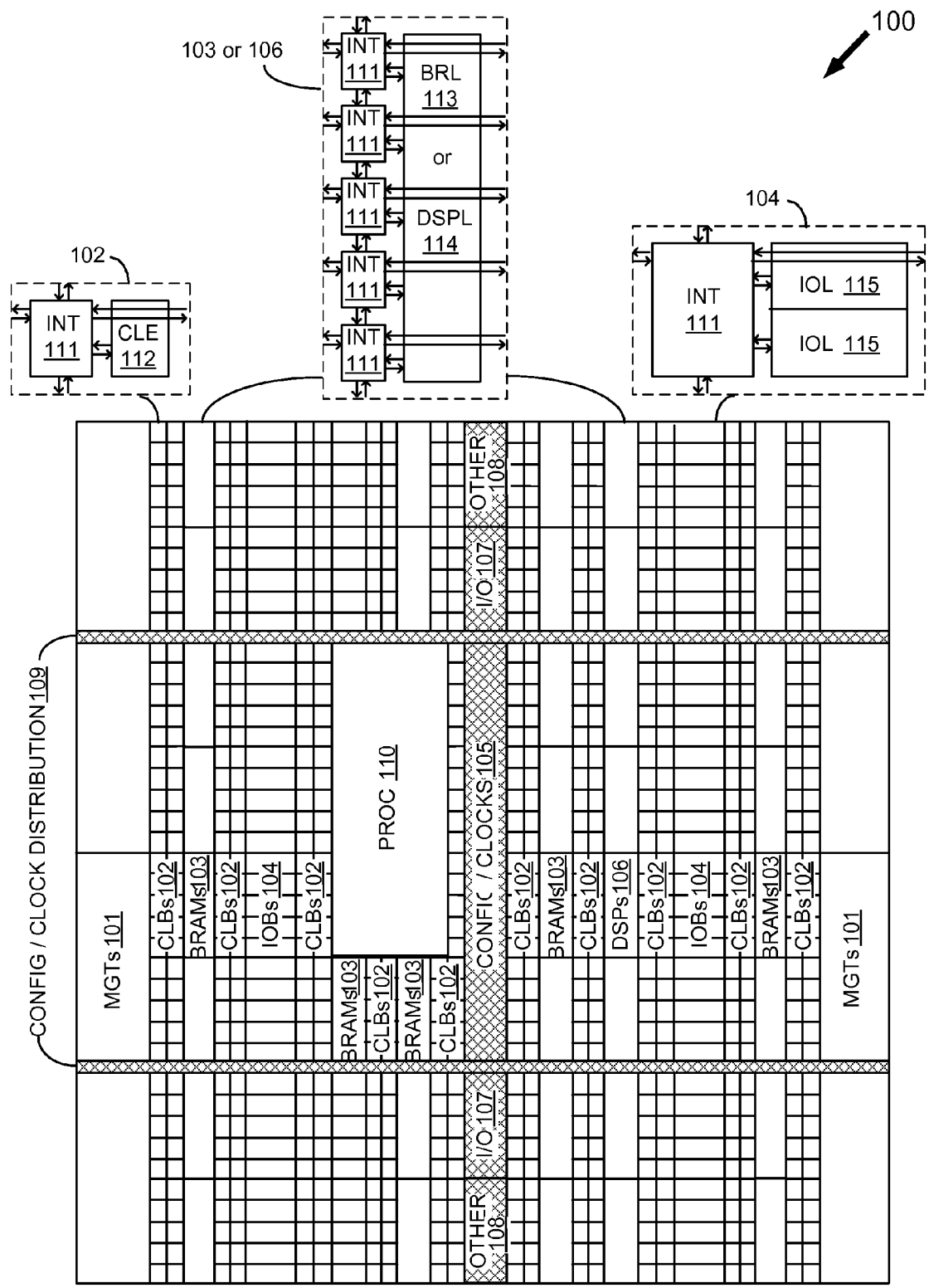
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
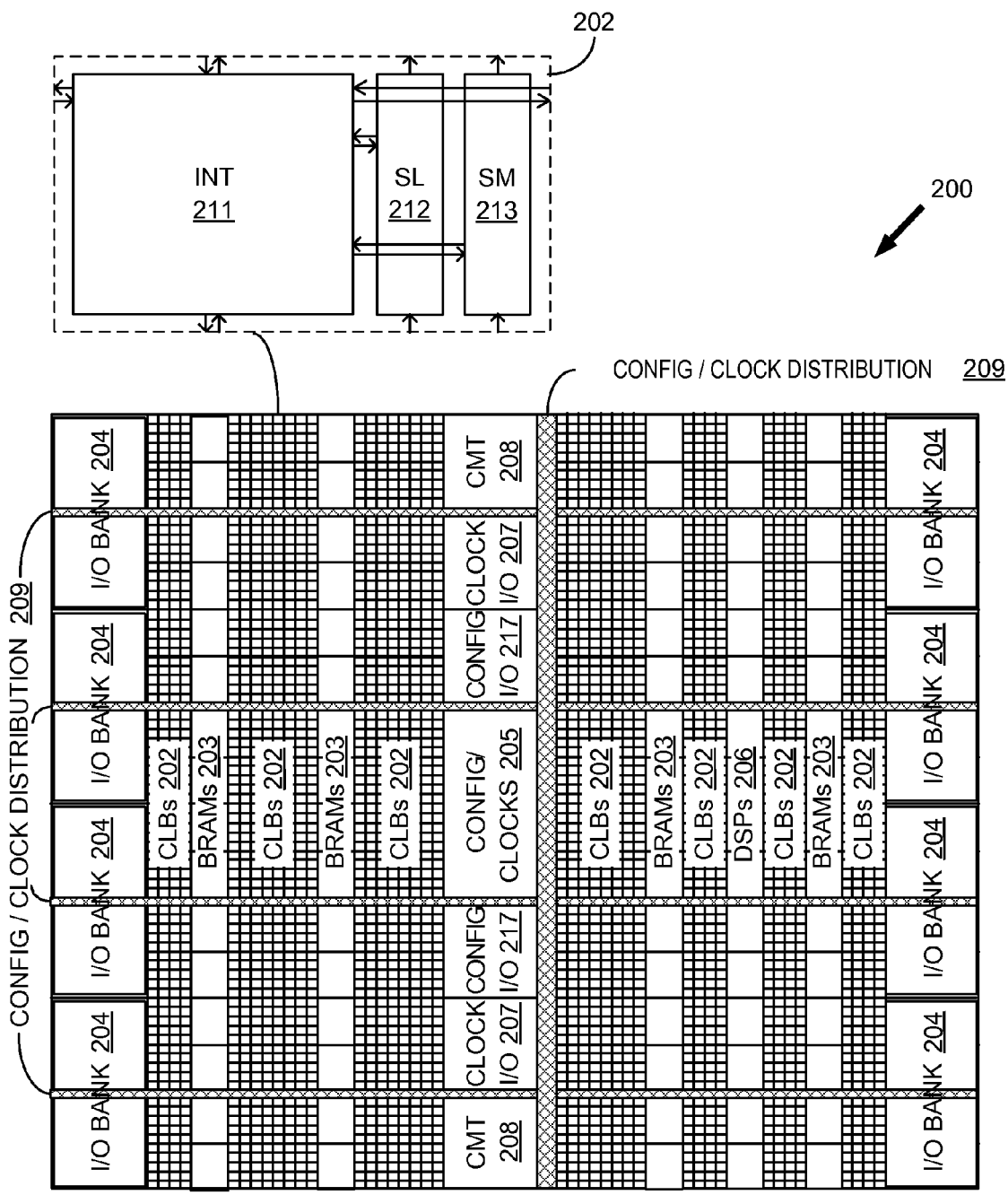
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
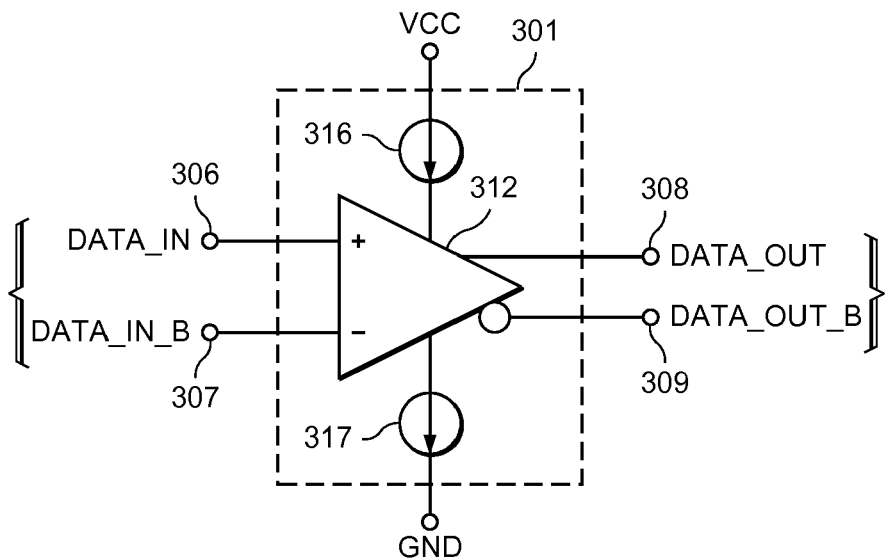
FIG. 3 is a circuit schematic showing a conventional circuit that is an integral portion of each of the FPGA architectures of FIGS. 1 and 2.

FIG. 3 is a circuit schematic showing a conventional circuit 301 that is an integral portion of each of the FPGA architectures of FIGS. 1 and 2. The circuit 301 has two input terminals 306 and 307, and two output terminals 308 and 309. The input terminals 306 and 307 receive a differential data signal, in the form of a signal pair DATA_IN and DATA_IN_B. The circuit 301 supplies to the output terminals 308 and 309 a differential signal, in the form of a signal pair DATA_OUT and DATA_OUT_B. The circuit 301 includes a receiver 312 of a type known in the art, and two current sources 316 and 317 of a type known in the art. The receiver 312 and the current sources 316 and 317 are coupled in series with each other across a power source, represented in FIG. 3 by different voltages VCC and GND. The receiver 312 is disposed electrically between the current sources 316 and 317. The receiver 312 has a positive input coupled to the input terminal 306, and a negative input coupled to the input terminal 307. The receiver 312 also has two complementary outputs that are respectively coupled to the output terminals 308 and 309.

Figure 4:
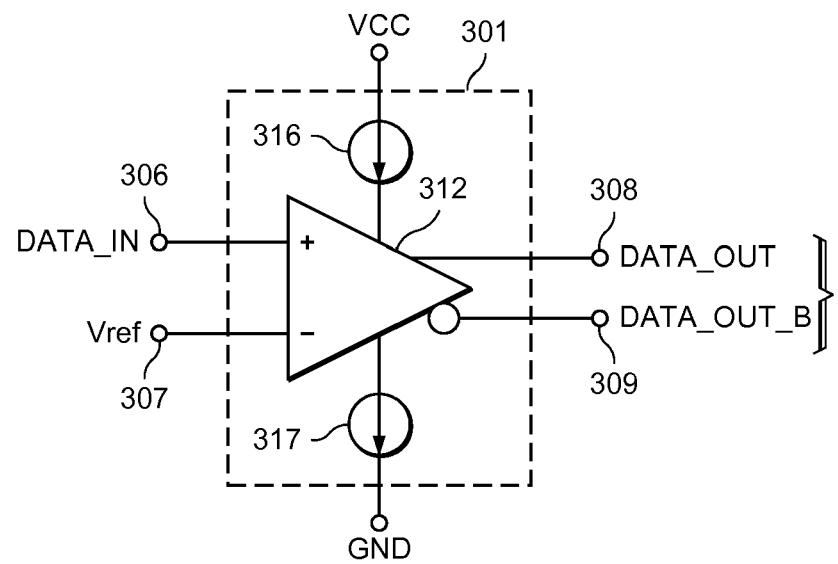
FIG. 4 is a circuit schematic showing the circuit of FIG. 3, with a different configuration for the input signal.

FIG. 4 is a circuit schematic showing the circuit 301 of FIG. 3, with a different configuration for the input signal. In particular, the input terminal 307 of the circuit 301 is coupled within the IC to a predetermined reference voltage Vref, and the input terminal 306 is coupled to a non-differential data input signal DATA_IN.

Some users will prefer that the circuit 301 of FIGS. 3 and 4 provide high performance without regard to power consumption, whereas other users will prefer that the circuit 301 operate with low power consumption, even if there is a sacrifice in performance. The pre-existing circuit 301 of FIGS. 3 and 4 can be designed to provide high performance, but in that case it does not optimally meet the requirements of users who need low power consumption. Alternatively, the circuit 301 can be designed to provide low power consumption. But in that case it does not optimally meet the requirements of users who need high performance. Consequently, regardless of which design approach is used, some users will not be entirely satisfied.

Figure 5:
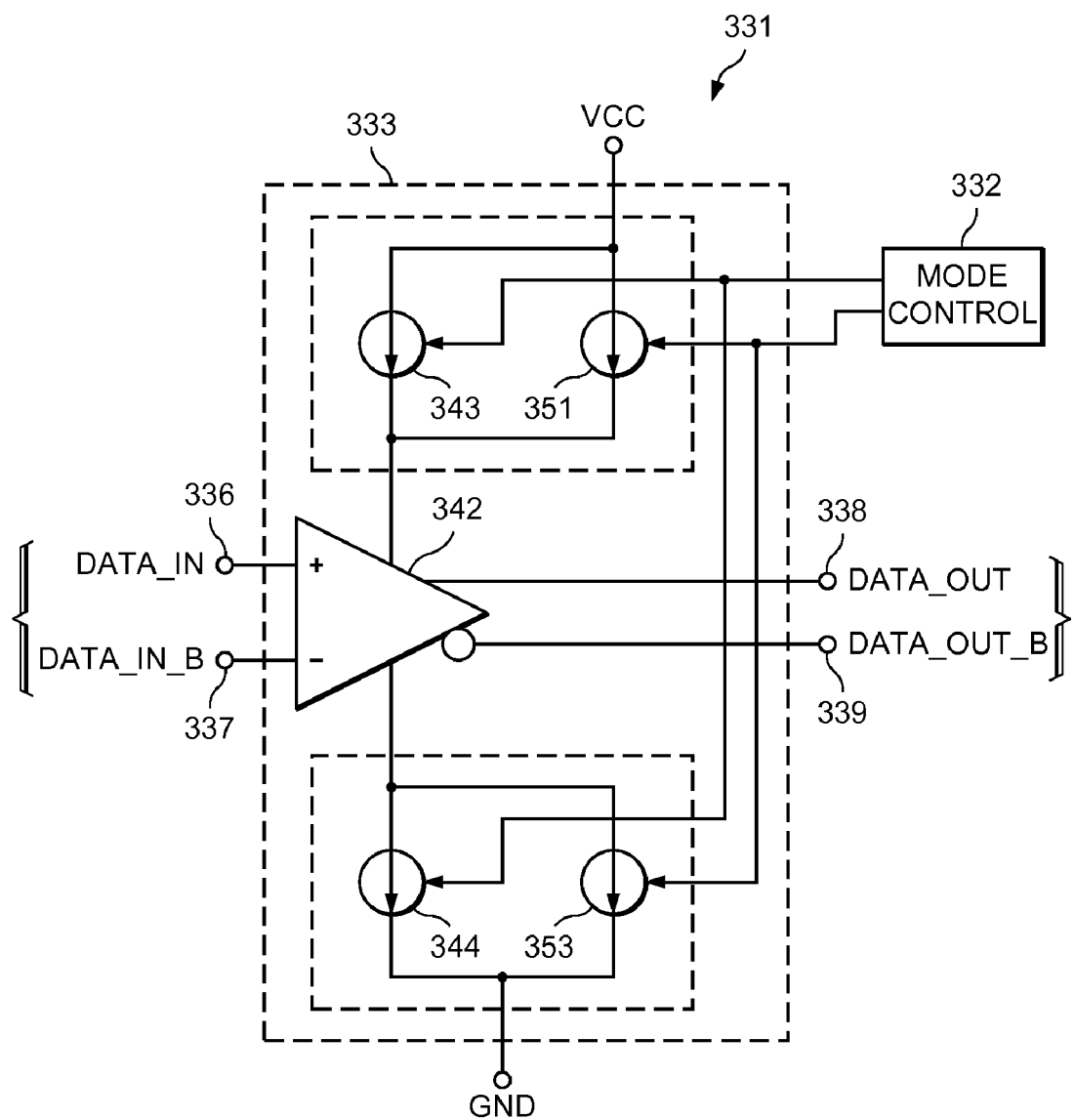
FIG. 5 is a circuit schematic showing circuitry that embodies aspects of the invention.

FIG. 5 is a circuit schematic showing circuitry 331 that may be an integral portion of an integrated circuit, for example each of the FPGA architectures depicted in FIGS. 1 and 2, and that embodies aspects of the invention. As discussed in more detail later, the circuitry 331 is capable of operating in any one of three different operational modes. In a first of these operational modes, the circuitry 331 is disabled. A second operational mode is a high performance mode, where power consumption is a secondary consideration. The third operational mode uses less power, but also provides a lower level of performance. A user can selectively specify which of these three modes the circuit 331 will operate in, depending on the needs of that particular user. In particular, the user can specify that the circuit 331 will be disabled, will operate in a high performance mode, or will operate in a low power mode.

The circuit 331 includes a mode control circuit 332, and a receiver circuit 333. In the embodiment of FIG. 5, the mode control circuit 332 contains two memory cells that are not separately shown, and that each store a single binary bit. The mode control circuit 332 has two outputs that each correspond to a respective memory cell, and that are each coupled to the receiver circuit 333. As discussed above, FPGA architectures of the type shown in FIGS. 1 and 2 have some capability to be configured or programmed by an end user. As part of this programming process, the user will specify whether each of the two memory cells in the mode control circuit 332 is to store a binary "0" or a binary "1". The state of the binary bits in the memory cells will determine whether the receiver circuit 333 is disabled, operates in the high performance mode, or operates in the low power mode.

The receiver circuit 333 has two data input terminals 336 and 337, and two data output terminals 338 and 339. The input terminals 336 and 337 receive a differential input signal, in the form of a signal pair DATA_IN and DATA_IN_B. The receiver circuit 333 supplies to the output terminals 338 and 339 a differential output signal, in the form of a signal pair DATA_OUT and DATA_OUT_B. The receiver circuit 333 also includes a receiver 342 of a type known in the art, and two current sources 343 and 344 of a type known in the art. The receiver 342 and the current sources 343 and 344 are coupled in series with each other across a power source, represented in FIG. 5 by different voltages VCC and GND. The receiver 342 is disposed electrically between the current sources 343 and 344. The receiver 342 has a positive input coupled to the input terminal 336, and a negative input coupled to the input terminal 337. The receiver 342 also has two complementary outputs that are respectively coupled to the output terminals 338 and 339.

The receiver circuit 333 also includes two additional current sources 351 and 353, which are each a circuit of a type known in the art. The current source 351 is coupled in parallel with the current source 343. The current source 353 is coupled in parallel with the current source 344. The current sources 343, 344, 351 and 353 each have an enable input. The enable inputs of the current sources 343 and 344 are coupled to one output of the mode control circuit 332, and the enable inputs of the current sources 351 and 353 are coupled to the other output of the mode control circuit.

As mentioned above, the receiver circuit 333 has three operational modes. In the first operational mode, the memory cells in the mode control circuit 332 each contain a binary "0", and the current sources 343, 344, 351 and 353 are all disabled, thereby effectively disabling the entire receiver circuit 333. In a second operational mode, the memory cells in the mode control circuit 332 each contain a binary "1", and the current sources 343, 344, 351 and 353 are all enabled. The current sources 343, 344, 351 and 353 serve to provide a generous flow of current to the receiver 342, so that the receiver 342 provides a high level of performance, but with a correspondingly high level of power consumption. In a third operational mode, one of the memory cells in the mode control circuitry 332 contains a binary "1", and the other memory cell contains a binary "0", such that the current sources 343 and 344 are enabled, but the current sources 351 and 353 are disabled. As a result, only the current sources 343 and 344 provide current to the receiver 342, and less current therefore flows through the receiver than when the current sources 343, 344, 351 and 353 are all enabled. Consequently, the receiver circuit 333 consumes less power, but also provides a lower level of performance.

Although FIG. 5 shows one extra current source 351 coupled in parallel with the current source 343, and one extra current source 353 coupled in parallel with the current source 344, it would alternatively be possible to have a larger number of current sources coupled in parallel with each of the current sources 343 and 344, and the mode control circuit 332 could optionally control each of the extra current sources. The current sources may be of equal or different sizes. For instance, each extra current source coupled in parallel may provide double the current of the precious current source. As a different alternative, FIG. 5 shows the mode control circuit 332 controlling each of the current sources 343, 344, 351 and 353. However, the mode control circuit 332 could control only the current sources 351 and 353. The current sources 343 and 344 could operate independently of the mode control circuit, and always be enabled. In this configuration, the receiver circuit would have just two operational modes, in particular the high performance mode and the low power mode. In another embodiment, current sources 351 and 353 may be larger than current sources 343 and 344, and an additional mode may be added where current sources 351 and 353 are enabled, and current sources 343 and 344 are disabled, where the additional mode may offer intermediate performance and power consumption.

Figure 6:
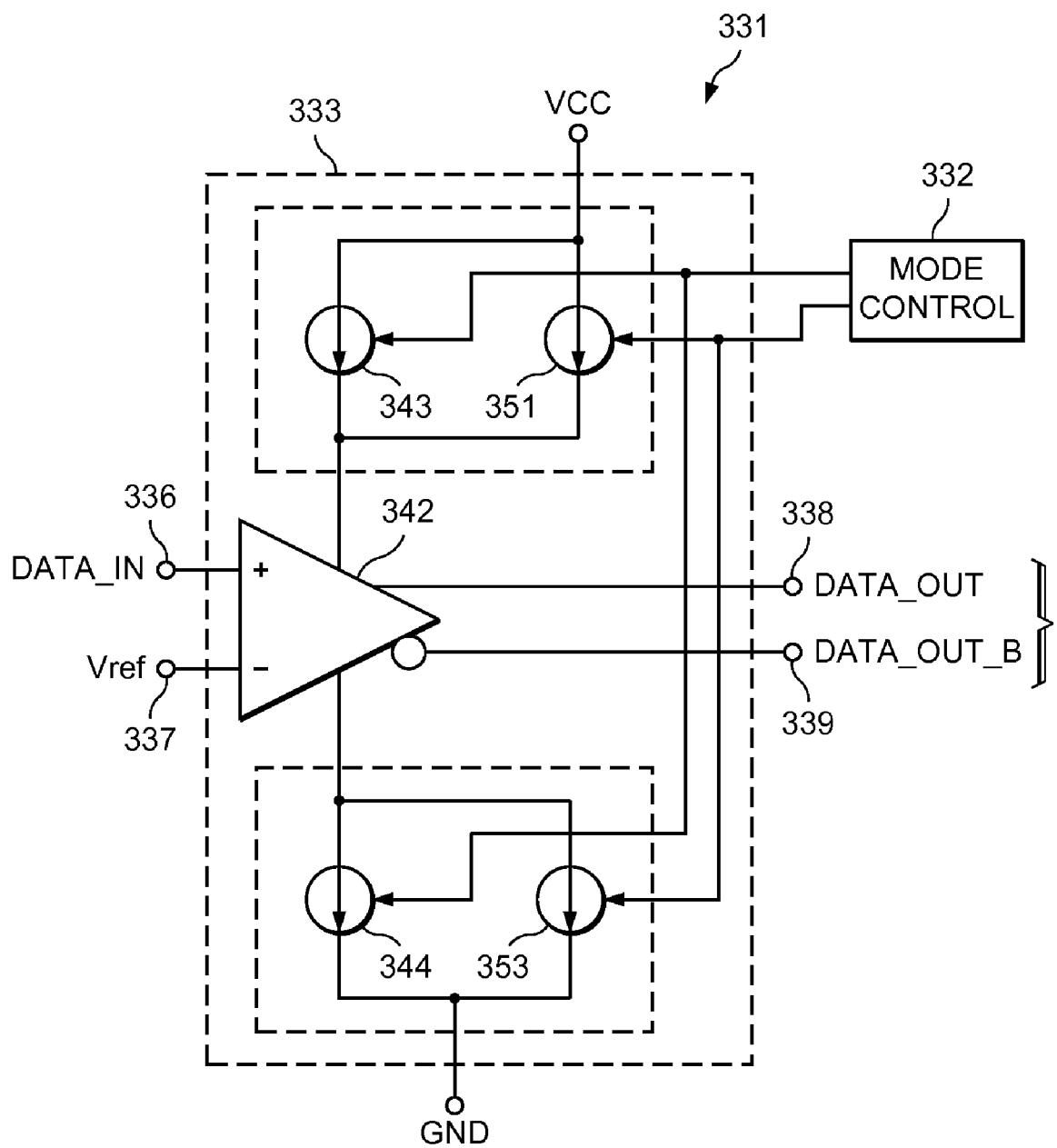
FIG. 6 is a circuit schematic showing the circuitry of FIG. 5, but with a different input configuration.

FIG. 6 is a circuit schematic showing the circuitry 331 of FIG. 5, but with a different input configuration. In particular, the two input terminals 336 and 337 do not receive a differential signal. Instead, the input terminal 337 is coupled within the IC to a predetermined reference voltage Vref. The input terminal 336 receives a data signal DATA_IN that is not a differential signal.

Figure 7:
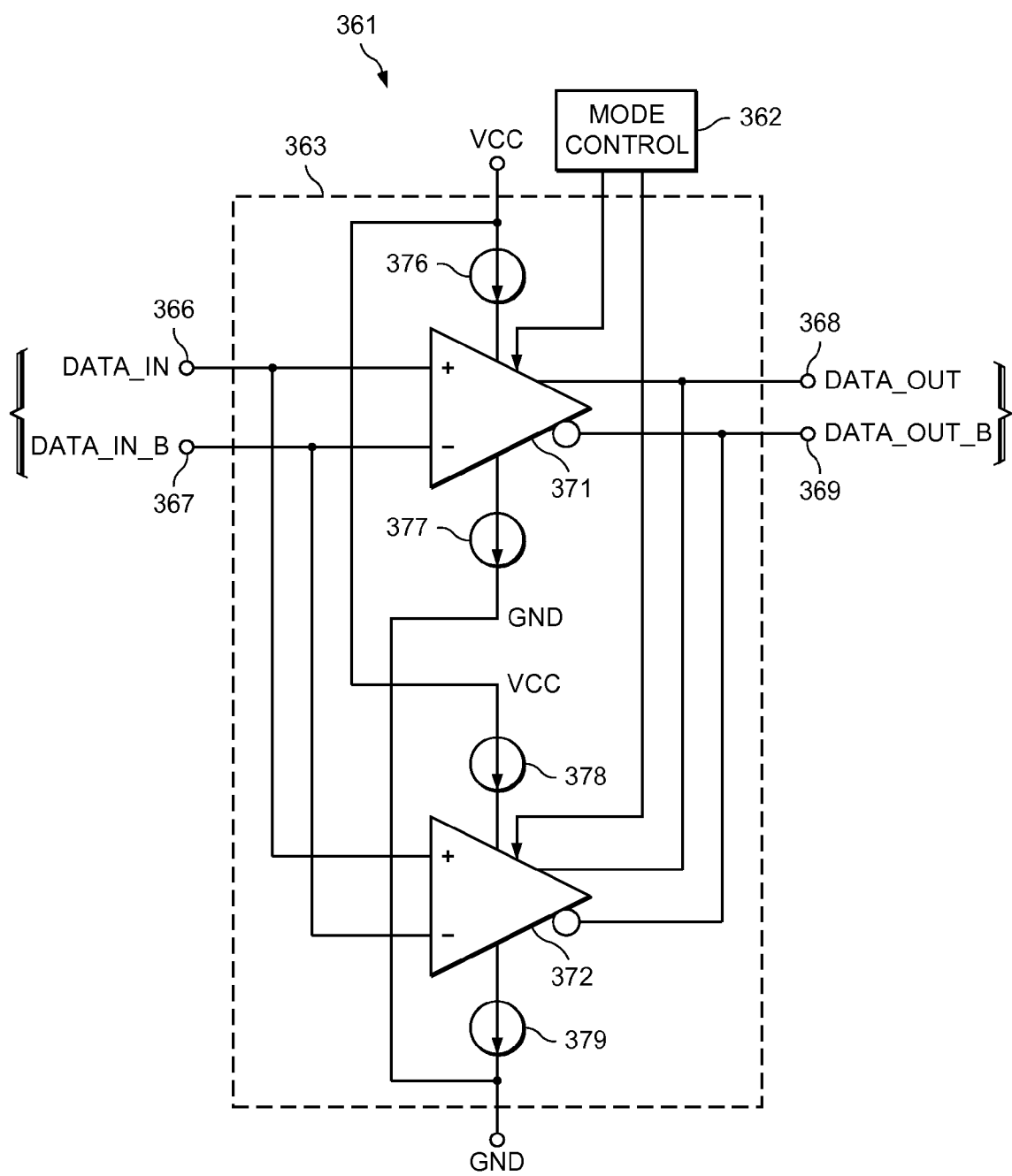
FIG. 7 is a circuit schematic showing circuitry that embodies aspects of the invention.

FIG. 7 is a circuit schematic showing circuitry 361 that may be an integral portion of an integrated circuit, for example each of the FPGA architectures of FIGS. 1 and 2, and that embodies aspects of the invention. The circuitry 361 includes a mode control circuit 362, and a receiver circuit 363. The mode control circuit 362 contains two memory cells that are not separately shown. Each of these memory cells can be programmed by a user to contain either a binary "1" or a binary "0". The mode control circuit 362 has two outputs that each correspond to a respective memory cell, and that are each coupled to the receiver circuit 363.

The receiver circuit 363 has two data input terminals 366 and 367, and these input terminals receive a differential data signal, in the form of a signal pair DATA_IN and DATA_IN_B. The circuit 363 also has two output terminals 368 and 369, and the receiver circuit 363 supplies to the output terminals 368 and 369 a differential signal, in the form of a signal pair DATA_OUT and DATA_OUT_B.

The receiver circuit 363 includes two receivers 371 and 372 of a known type, and four current sources 376, 377, 378 and 379 of a known type. The receiver 371 and the current sources 376 and 377 are coupled in series with each other across a power source, represented here by different voltages VCC and GROUND. Similarly, the receiver 372 and the current sources 378 and 379 are coupled in series with each other across the same power source. The receiver 371 is disposed electrically between the current sources 376 and 377, and the receiver 372 is disposed electrically between the current sources 378 and 379. The receivers 371 and 372 each have a positive input that is coupled to the input terminal 366, and a negative input that is coupled to the input terminal 367. Further, the receiver 371 has complementary outputs that are respectively coupled to the output terminals 368 and 369, and the receiver 372 has complementary outputs that are respectively coupled to the output terminals 368 and 369. The receivers 371 and 372 each have an enable input. The enable input of the receiver 371 is coupled to one output of the mode control circuit 362, and the enable input of the receiver 372 is coupled to the other output of the mode control circuit 362.

The receiver circuit 363 has three operational modes. In the first operational mode, the memory cells in the mode control circuit 362 each contain a binary "0", and the receivers 371 and 372 are each disabled. In a second operational mode, the memory cells in the mode control circuit 362 each contain a binary "1", and the receivers 371 and 372 are both enabled. The receiver circuit 363 provides high performance, but with a correspondingly high level of power consumption. In a third operational mode, one of the memory cells in the mode control circuitry 362 contains a binary "1", and the other memory cell contains a binary "0", such that the receiver 371 is enabled and the receiver 372 is disabled. The receiver circuit 363 therefore consumes less power, but also provides a lower level of performance.

Figure 8:
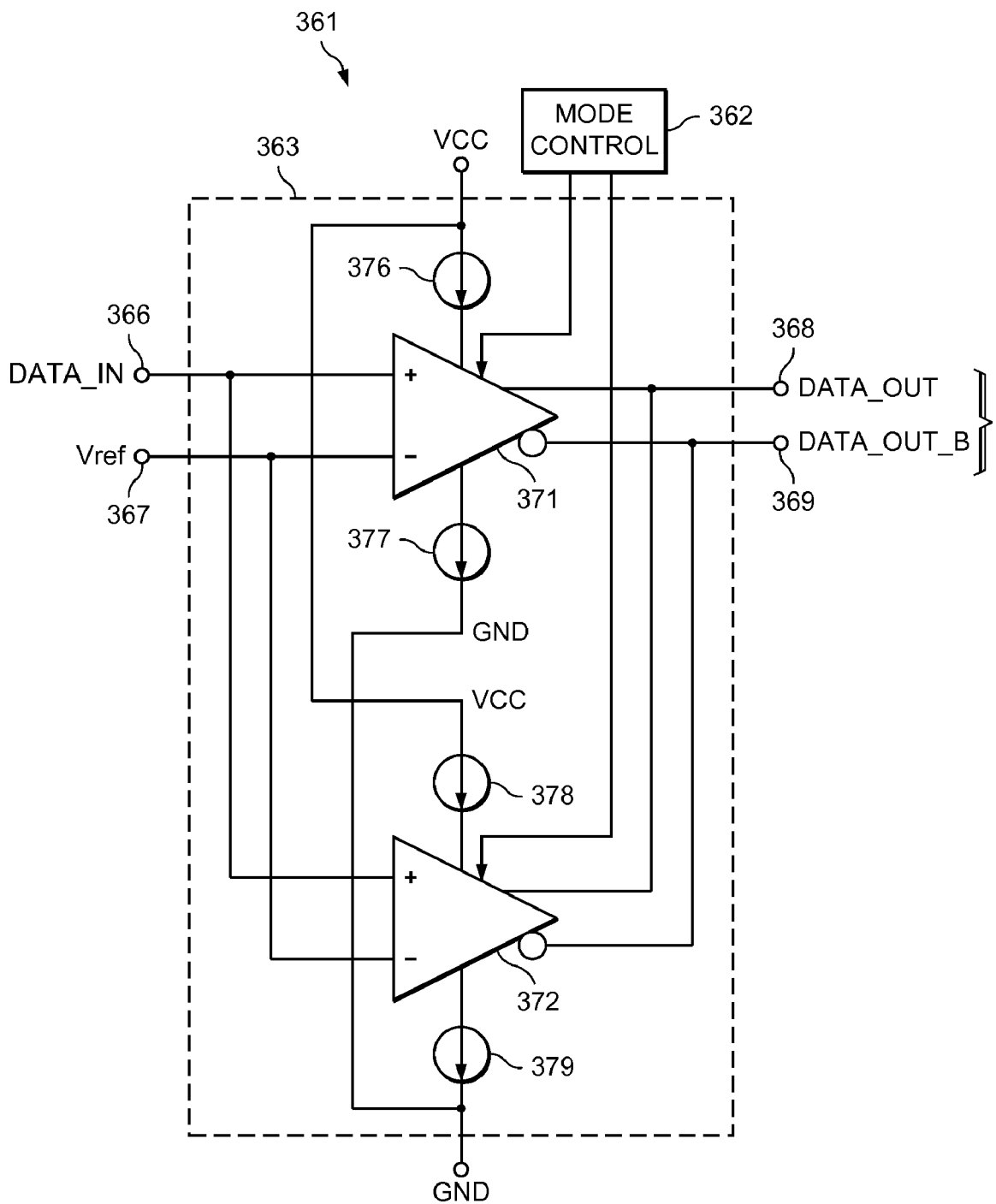
FIG. 8 is a circuit schematic showing the circuitry of FIG. 7, but with a different input configuration.

FIG. 8 is a circuit schematic showing the circuitry 361 of FIG. 7, but with a different input configuration. In particular, the input terminal 367 is coupled within the IC to a predetermined reference voltage Vref. The input terminal 366 receives a non-differential data input signal DATA_IN.

Although the circuitry 361 of FIGS. 7 and 8 has two receivers 371 and 372 that can each be selectively enabled and disabled, it would alternatively be possible to provide a larger number of receivers that can be selectively enabled and disabled.

Although selected embodiments have been illustrated and described in detail, it should be understood that a variety of substitutions and alterations are possible without departing from the spirit and scope of the present invention, as defined by the claims that follow.

What is claimed is:

1. An apparatus comprising circuitry that comprises:
a mode control section that is programmable to have one of first and second states; and
a receiver section having first and second input terminals and having an output terminal, the receiver section being responsive to the mode control section for operating in a first operational mode when the mode control section has the first state and for operating in a second operational mode when the mode control section has the second state, wherein in the first operational mode the receiver section provides higher performance and consumes more power than in the second operational mode;
wherein the receiver section includes first and second receiver circuits that each have first and second inputs respectively coupled to the first and second input terminals, and that each have an output coupled to the output terminal;
wherein the first receiver circuit operates in each of the first and second operational modes; and
wherein the second receiver circuit has an enable input coupled to the mode control section, the second receiver circuit being enabled and operating in the first operational mode, and being disabled in the second operational mode.

2. The apparatus according to claim 1,
wherein the mode control section is programmable to have a third state different from each of the first and second states;
wherein the receiver section has a third operational mode different from each of the first and second operational modes, the receiver section operating in the third operational mode when the mode control section has the third state; and
wherein the first receiver circuit has an enable input coupled to the mode control section, the first receiver circuit being disabled in the third operational mode.

3. The apparatus according to claim 1, wherein the receiver section has a further output terminal, and the receiver circuits each have a further output that is coupled to the further output terminal, the receiver section supplying a differential signal to the output terminals.

4. The apparatus according to claim 1, wherein the first input terminal of the receiver section receives a data input signal, and the second input terminal of the receiver section is coupled to a reference voltage.

5. The apparatus according to claim 1, wherein the first and second input terminals of the receiver section receive a differential data input signal.

6. A method of operating circuitry having a programmable mode control section, and a receiver section with first and second input terminals and an output terminal, the receiver section having first and second receiver circuits that each have first and second inputs respectively coupled to the first and second input terminals, and that each have an output coupled to the output terminal, the method comprising:
setting the mode control section to one of first and second states in response to user input; and
operating the receiver section in a first operational mode when the mode control section has the first state and in a second operational mode when the mode control section has the second state, wherein in the first operational mode the receiver section provides higher performance and consumes more power than in the second operational mode;
operating the first receiver circuit in each of the first and second operational modes;
enabling and operating the second receiver circuit in the first operational mode, wherein the second receiver circuit has an enable input coupled to the programmable mode control section; and
disabling the second receiver circuit in the second operational mode.

7. The method according to claim 6,
wherein the receiver section comprises a current control section; and
wherein the operating the receiver section comprises causing the current control section to supply more current to the receiver circuit in the first operational mode than in the second operational mode.

8. The method according to claim 6,
wherein the setting the mode control section comprises setting the mode control section to one of the first state, the second state and a third state in response to the user input; and
wherein the operating the receiver section comprises responding to the mode control section having the third state by operating the receiver section in a third operational mode in which each of the first and second receiver circuits are disabled.

9. The method according to claim 6,
including a programmable device having the circuitry therein; and
including programming the programmable device in response to user input, the programming comprising the setting of the mode control section.

* * * * *